US012635553B2

(12) United States Patent
Cheng et al.

(10) Patent No.: US 12,635,553 B2
(45) Date of Patent: May 19, 2026

(54) SEMICONDUCTOR DEVICE HAVING A REDISTRIBUTION LINE

(71) Applicant: TAIWAN SEMICONDUCTOR MANUFACTURING COMPANY, LTD., Hsinchu (TW)

(72) Inventors: Anhao Cheng, Hsinchu (TW); Chun-Chang Liu, Hsinchu (TW); Sheng-Wei Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 639 days.

(21) Appl. No.: 17/830,658

(22) Filed: Jun. 2, 2022

(65) Prior Publication Data

US 2022/0302060 A1 Sep. 22, 2022

Related U.S. Application Data

(60) Continuation of application No. 16/746,768, filed on Jan. 17, 2020, now Pat. No. 11,373,970, which is a
(Continued)

(51) Int. Cl.
*H01L 23/00* (2006.01)
*H01L 21/02* (2006.01)
(Continued)

(52) U.S. Cl.
CPC ........ *H01L 24/09* (2013.01); *H01L 21/02118* (2013.01); *H01L 21/0217* (2013.01);
(Continued)

(58) Field of Classification Search
CPC .............. H01L 24/09; H01L 21/02118; H01L 21/0217; H01L 21/02282; H01L 23/3171; H01L 23/3192; H01L 23/5283; H01L 23/53295; H01L 23/562; H01L 23/525; H01L 24/03; H01L 24/05; H01L 24/06; H01L 24/13; H01L 2224/023; H01L 2224/02317; H01L 2224/02321; H01L 2224/0233; H01L 2224/0235; H01L 2224/0236; H01L 2224/0345; H01L 2224/03462; H01L 2224/03464; H01L 2224/0401; H01L 2224/05552; H01L 2224/05553; H01L 2224/05611;
(Continued)

(56) References Cited

U.S. PATENT DOCUMENTS

| | | | |
|---|---|---|---|
| 4,412,885 A | 11/1983 | Wang | |
| 6,077,789 A | 6/2000 | Huang | |

(Continued)

*Primary Examiner* — Michelle Mandala
(74) *Attorney, Agent, or Firm* — Hauptman Ham, LLP

(57) ABSTRACT

A semiconductor device includes a first passivation layer over a substrate. The semiconductor device further includes a post passivation interconnect (PPI) line over the first passivation layer, wherein a top-most portion of the PPI line has a first portion having a convex shape and a second portion having a concave shape. The semiconductor device further includes a second passivation layer configured to cause stress to the PPI line. The semiconductor device further includes a polymer material over the second passivation layer.

20 Claims, 4 Drawing Sheets

Related U.S. Application Data division of application No. 15/399,956, filed on Jan. 6, 2017, now Pat. No. 10,541,218.

(60) Provisional application No. 62/427,564, filed on Nov. 29, 2016.

(51) Int. Cl.

| | |
|---|---|
| *H01L 23/31* | (2006.01) |
| *H01L 23/528* | (2006.01) |
| *H01L 23/532* | (2006.01) |
| *H01L 23/525* | (2006.01) |

(52) U.S. Cl.

CPC .... *H01L 21/02282* (2013.01); *H01L 23/3171* (2013.01); *H01L 23/3192* (2013.01); *H01L 23/5283* (2013.01); *H01L 23/53295* (2013.01); *H01L 23/562* (2013.01); *H01L 23/525* (2013.01); *H01L 24/03* (2013.01); *H01L 24/05* (2013.01); *H01L 24/06* (2013.01); *H01L 24/13* (2013.01); *H01L 2224/023* (2013.01); *H01L 2224/02317* (2013.01); *H01L 2224/02321* (2013.01); *H01L 2224/0233* (2013.01); *H01L 2224/0235* (2013.01); *H01L 2224/0236* (2013.01); *H01L 2224/0345* (2013.01); *H01L 2224/03462* (2013.01); *H01L 2224/03464* (2013.01); *H01L 2224/0401* (2013.01); *H01L 2224/05552* (2013.01); *H01L 2224/05553* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/0613* (2013.01); *H01L 2224/06137* (2013.01); *H01L 2224/13014* (2013.01); *H01L 2224/13022* (2013.01); *H01L 2224/13101* (2013.01); *H01L 2924/00014* (2013.01); *H01L 2924/014* (2013.01); *H01L 2924/1304* (2013.01)

(58) Field of Classification Search

CPC ........... H01L 2224/05624; H01L 2224/05639; H01L 2224/05644; H01L 2224/05647; H01L 2224/0613; H01L 2224/06137; H01L 2224/13014; H01L 2224/13022; H01L 2224/13101; H01L 2924/00014; H01L 2924/014; H01L 2924/1304

See application file for complete search history.

(56) References Cited

U.S. PATENT DOCUMENTS

| | | | | |
|---|---|---|---|---|
| 6,376,353 | B1 | 4/2002 | Zhou | |
| 8,035,226 | B1* | 10/2011 | Wilcoxen | H01L 24/13 |
| | | | | 257/737 |
| 9,553,058 | B1* | 1/2017 | England | H01L 24/03 |
| 10,453,811 | B2 | 10/2019 | Lin et al. | |
| 2001/0051423 | A1 | 12/2001 | Kim | |
| 2004/0067623 | A1 | 4/2004 | Chuang | |
| 2007/0181883 | A1 | 8/2007 | Ando | |
| 2008/0185724 | A1 | 8/2008 | Tseng | |
| 2008/0237879 | A1 | 10/2008 | Yang | H01L 24/24 |
| | | | | 438/106 |
| 2009/0278263 | A1* | 11/2009 | McCarthy | H01L 23/525 |
| | | | | 257/E23.141 |
| 2010/0065954 | A1* | 3/2010 | Tu | H01L 25/0655 |
| | | | | 257/784 |
| 2010/0140752 | A1* | 6/2010 | Marimuthu | H01L 23/3121 |
| | | | | 257/E29.112 |
| 2010/0301459 | A1* | 12/2010 | Akiba | H01L 24/05 |
| | | | | 257/737 |
| 2012/0164827 | A1 | 6/2012 | Rajagopalan | |
| 2012/0164829 | A1 | 6/2012 | Rajagopalan et al. | |
| 2012/0299167 | A1 | 11/2012 | Chen et al. | |
| 2013/0200528 | A1* | 8/2013 | Lin | H01L 24/97 |
| | | | | 257/774 |
| 2013/0241049 | A1 | 9/2013 | Yu et al. | |
| 2013/0279845 | A1 | 10/2013 | Kobrinsky | |
| 2013/0299967 | A1* | 11/2013 | Daniels | H01L 24/05 |
| | | | | 438/689 |
| 2014/0252548 | A1 | 9/2014 | Yen et al. | |
| 2014/0264866 | A1 | 9/2014 | Liu et al. | |
| 2014/0346665 | A1 | 11/2014 | Lin et al. | |
| 2015/0031184 | A1 | 1/2015 | Yen et al. | |
| 2015/0041985 | A1* | 2/2015 | Hsieh | H01L 23/5329 |
| | | | | 257/773 |
| 2015/0108654 | A1 | 4/2015 | Rao | |
| 2015/0171209 | A1 | 6/2015 | Jiang | |
| 2015/0228599 | A1 | 8/2015 | Lai et al. | |
| 2017/0110425 | A1 | 4/2017 | Huang et al. | |
| 2017/0352631 | A1* | 12/2017 | Chuang | H01L 24/13 |
| 2018/0033745 | A1 | 2/2018 | Cheng | |

\* cited by examiner

300

300

300

300

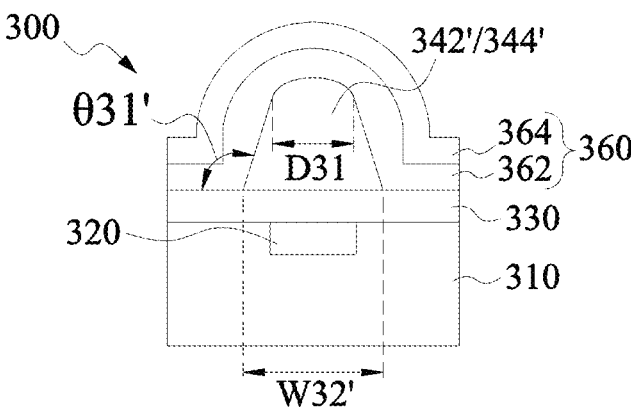
Fig. 3E
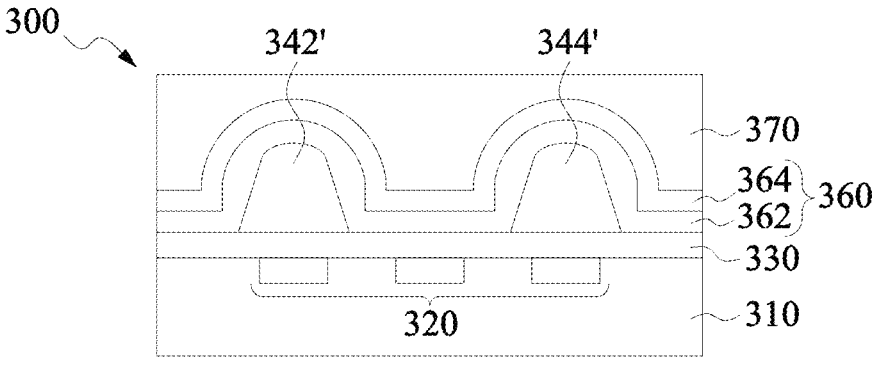
Fig. 3F
Fig. 3G

SEMICONDUCTOR DEVICE HAVING A REDISTRIBUTION LINE

RELATED APPLICATIONS

The current application is a continuation of U.S. application Ser. No. 16/746,768, filed Jan. 17, 2020, now U.S. Pat. No. 11,373,970, which is a divisional application of U.S. application Ser. No. 15/399,956, filed Jan. 6, 2017, now U.S. Pat. No. 10,541,218, issued Jan. 21, 2020, which claims priority to U.S. Provisional Application No. 62/427,564, filed Nov. 29, 2016, the entireties of which are hereby incorporated by reference.

BACKGROUND

A semiconductor integrated circuit (IC) includes both active devices, such as transistors and diodes, and passive devices, such as resisters and capacitors. Devices are initially isolated from each other in a front-end-of-line (FEOL) process, and later coupled to each other in a back-end-of-line (BEOL) process to perform functional operations. The BEOL process includes fabrication of interconnect structures, conductive pads and bumps. The conductive pads are arranged around a die for wire bonding and the bumps are arranged in an array for die stacking. A redistribution layer (RDL) structure is used to connect the conductive pad with the bump. Electrical connections are therefore made through the conductive pads to connect the die to a substrate or another die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3G are cross-sectional views taken along line L-L' in FIG. 1 at various stages of fabrication in accordance with one or more embodiments.

DETAILED DESCRIPTION

Figure 1:
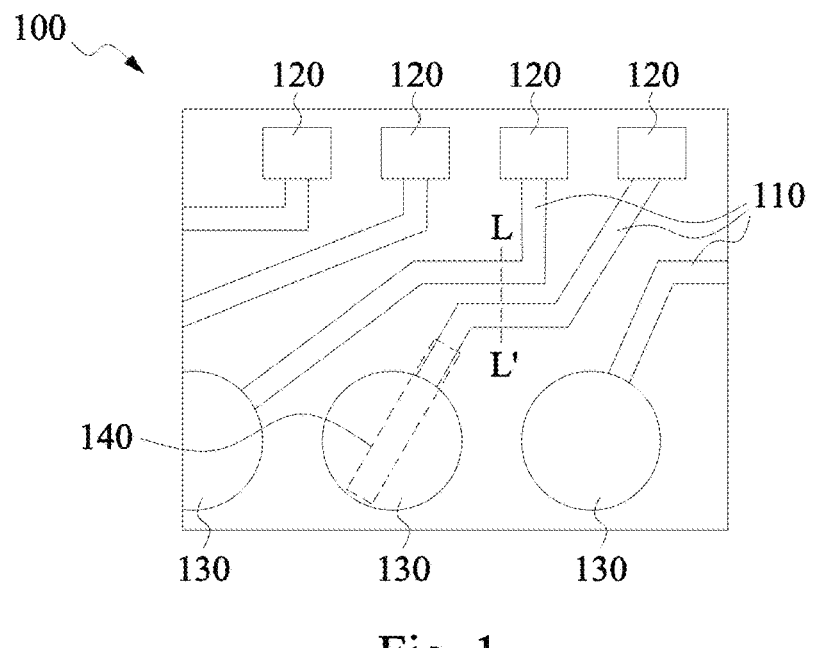
FIG. 1 is a schematic plan view of a semiconductor device having redistribution layer structures in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technology evolves, a geometrical size of interconnect structures decreases to increase integrated circuit (IC) density, lower manufacturing cost and improve device performance. The interconnect structures include lateral interconnections, such as metal lines (wirings), and vertical interconnections, such as contacts and via plugs. The metal lines and via plugs are formed in inter-metal dialectic (IMD) layers. On top of IMD layers, conductive pads are formed and connected to solder bumps through the redistribution layer (RDL) structures. One type of semiconductor packaging is wafer level chip scale packaging (WLCSP), in which a die is packaged in a way that uses the RDL structures to fan out electrical connections for conductive pads to rewire and reposition external terminals at desired locations.

Typically, a protective layer is over the RDL structures to help block moisture and reduce delamination, causing a high chip rejection rate. With smaller process geometries, more defects, such as voids, are generated between the RDL structures. Voids weaken the mechanical strength of the IC devices; and are susceptible to being filled during subsequent deposition processes which changes the electrical properties of the RDL structures. Therefore, the production yield has become sensitive to a trench-filling process between the RDL structures.

In some embodiments, a top portion of the RDL structure has a rounded shape, resulting in an improved step coverage of the subsequent protective layer. Accordingly, defects associated with the trench-filling process of the protective layer is reduced. In some embodiments, the rounded shape of the RDL structure is formed by a strained passivation layer. In some embodiments, the rounded shape is formed by trimming a shape of a mask layer. In some embodiments, a dimension of the rounded shape is further reduced by a combination of the strained passivation layer and the mask layer trimming. In some embodiments, after the formation of the strained passivation layer, the rounded shaped is adjusted by a curing process.

FIG. 1 is a schematic plan view of a semiconductor device 100 having RDL structures 110 in accordance with one or more embodiments. Semiconductor device 100 further includes conductive pads 120, also referred to as bonding pads, I/O pads or contact pads, and bumps 130. RDL structures 110 electrically connect to corresponding conductive pads 120 and bumps 130. In some embodiments, in a semiconductor die, conductive pads 120 extends beyond an outer periphery of bumps 130. In some embodiments, bumps 130 are arranged in a ball grid array (BGA). In some embodiments, conductive pad 120 includes at least aluminum, copper, aluminum-copper or another suitable material. An under-bump metallurgy (UBM) structure 140 is between RDL structure 110 and bump 130. In some embodiments, an entirety of UBM structure 140 is overlapped by bump 130. In some embodiments, UMB structure 140 extends beyond an edge of bump 130 along a direction parallel to a length of RDL structure 110. In some embodiments, UBM structure 140 connects to RDL structure 110.

Figure 2:
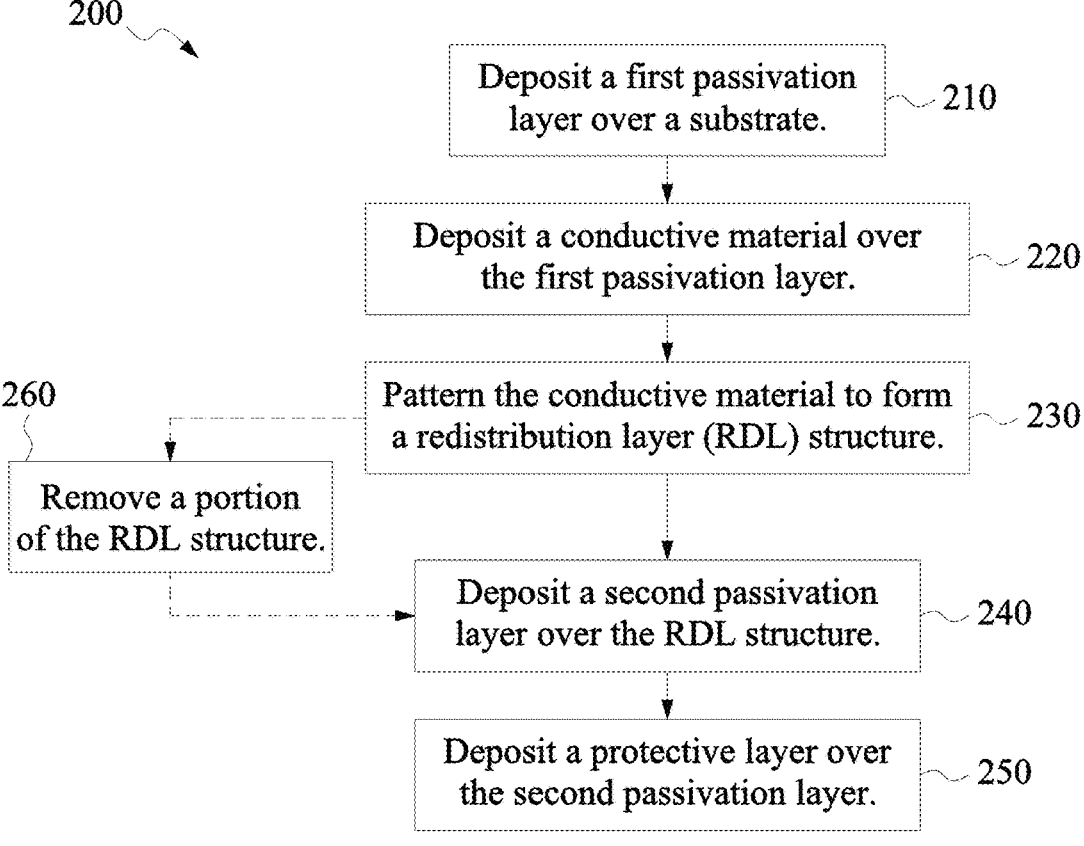
FIG. 2 is a flow chart of a method of fabricating a redistribution layer structure in accordance with one or more embodiments.

FIG. 2 is a flowchart of a method 200 of fabricating a RDL structure in accordance with one or more embodiments. One of ordinary skill in the art would understand that additional operations are able to be performed before, during, and/or after method 200 depicted in FIG. 2, in some embodiments. Method 200 includes operation 210 in which a first passivation layer is deposited over a substrate. In some embodiments, the substrate includes an interconnect structuring having layers extending from a bottom metal layer to a top metal layer. In some embodiments, the top metal layer is a topmost metal line that is formed in an IMD layer. In some embodiments, the IMD layer includes a low dielectric constant (low-k; LK) dielectric material. In some embodiments, the first passivation layer is used to help protect IC devices and interconnect structures from damage and contamination. In some embodiments, the formation of the first passivation layer includes a deposition process. In some embodiments, the first passivation layer includes a dielectric material.

Method 200 continues with operation 220 in which a conductive material is deposited over the first passivation layer. In some embodiments, an opening is formed in the first passivation layer to expose a conductive pad. In some embodiments, the conductive material is over and electrically connected to the conductive pad. As a result, the conductive material includes a recessed portion extending along sidewalls of the opening and on the conductive pad; and a planar portion extending along a top surface of the first passivation layer.

Figure 3A:
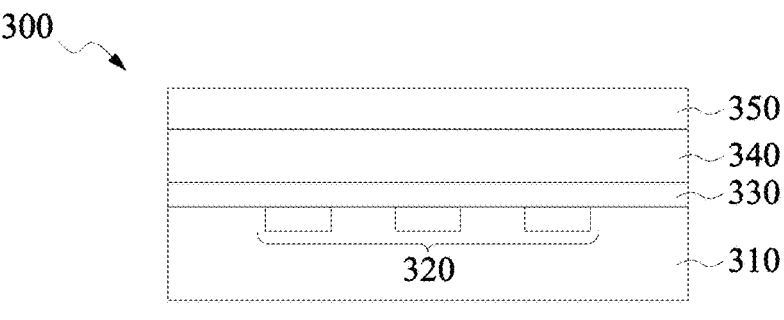

FIGS. 3A to 3G are schematic cross-sectional views taken along line L-L' in FIG. 1 at various stages of fabrication in accordance with one or more embodiments. FIG. 3A is a cross-sectional view of a semiconductor device 300 following operation 220 in accordance with one or more embodiments. In some embodiments, semiconductor device 300 includes a substrate 310 and one or more interconnect structures 320. In some embodiments, substrate 310 is made of a silicon or other bulk semiconductor material. In some embodiments, substrate 310 is a silicon on insulator layer (SOI) substrate or a silicon on sapphire (SOS) substrate. In some embodiments, substrate 310 includes IC devices (not shown), an inter-layer dielectric (ILD) (not shown) over the IC devices and interconnect structures 320 over the ILD. Interconnect structures 320 include metal lines and via plugs, which are formed in IMD layers (not shown). In some embodiments, the metal lines or the via plugs include at least one of aluminum, copper, copper alloy, tungsten, gold or another suitable material. In some embodiments, the IMD layers include a low-k dielectric material, which has a dielectric constant lower than 3, or an extreme low-k (ELK) dielectric material, which has a dielectric constant lower than 2.6. In some embodiments, a combination of metal lines formed in a same IMD layer is referred to as a metal layer at a same level. The metal lines at different levels are electrically connected through the via plugs.

Semiconductor device 300 further includes a first passivation layer 330, a conductive material 340 and a mask layer 350. First passivation layer 330 is over interconnect structures 320. In some embodiments, conductive pad 120 (best seen in FIG. 1) is between first passivation layer 330 and interconnect structures 320 and is electrically connected to interconnect structures 320. In some embodiments, first passivation layer 330 is formed over a topmost metal layer of interconnect structures 320. In some embodiments, a via plug is formed in first passivation layer 330 and electrically connected to the IC devices in substrate 310 through interconnect structures 320. In some embodiments, first passivation layer 330 includes a dielectric material having a dielectric constant greater than 3.7. In some embodiments, first passivation layer 330 is a composite material including silicon oxide, silicon nitride, silicon oxynitride, undoped silicate glass (USG), epoxy, benzocyclobutene (BCB), polybenzoxazole (PBO) or another suitable material. In at least one embodiment, at least one opening is formed in portions of passivation layer 330 to expose a central portion of conductive pads 120.

The formation of conductive pad 120 includes deposition, photolithography and etching processes. In some embodiments, the deposition process includes sputtering, electrolytic plating or electroless plating process. In some embodiments, conductive pad 120 includes at least one of aluminum, copper, copper alloy, tin, nickel, gold, silver or another suitable material. In some embodiments, conductive pad 120 includes the same materials as conductive material 340. In some embodiments, conductive pad 120 includes different materials from conductive material 340.

Conductive material 340 is over first passivation layer 330. In some embodiments, the formation of conductive material 340 includes electrolytic plating, electroless plating, sputtering, chemical vapor deposition (CVD) or another suitable process. In some embodiments, conductive material 340 includes a metal with a greater malleability. The malleability is measured by magnitude of a compressive force a metal withstands before breaking. In some embodiments, the metal has a Mohs hardness value less than or equal to about 4. In some embodiments, conductive material 340 includes aluminum, aluminum alloy, gold, silver, plumbum, tin, copper or another suitable material. In some embodiments, the at least one opening is partially filled during the formation of conductive material 340. In some embodiments, a planarization process, such as chemical mechanical polishing (CMP) or etching process, is performed to remove a portion of conductive material 340. A mask layer 350 is subsequently formed over conductive material 340. In some embodiments, mask layer 350 includes a photoresist, a hard mask or another suitable material. In at least one embodiment, the hard mask includes silicon nitride, silicon oxynitride, silicon carbide or another suitable material. In some embodiments, the hard mask includes an anti-reflecting coating (ARC) material. The formation of mask layer 350 includes deposition processes, such as physical vapor deposition (PVD), sputtering or spin-on deposition (SOD).

Returning to FIG. 2, method 200 continues with operation 230 in which a portion of conductive material is removed to form an RDL structure. A mask layer defines a shape of the RDL structure by using photolithography and etching processes. In some embodiments, the RDL structure and conductive pads are formed in a same process step. In some embodiments, the RDL structure and the conductive pad are formed in different process steps. In at least one embodiment, the RDL structure is referred to as a post-passivation interconnect (PPI) structure.

Figure 3B:
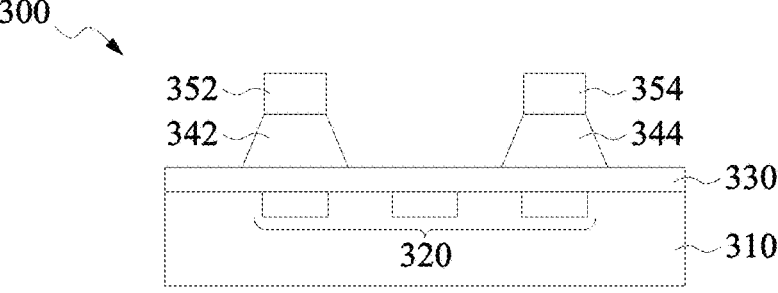

FIG. 3B is a cross-sectional view of semiconductor device 300 following operation 230 in accordance with one or more embodiments. A remaining mask layer 352/354 is over an RDL structure 342/344. Remaining mask layer 352/354 is patterned by removing a portion of mask layer 350. Subsequently, remaining mask layer 352/354 is left as a hard mask to remove a portion of conductive material 340 so as to form RDL structure 342/344 and/or conductive pads 120, in some instances. The removal of a portion of mask layer 350 and a portion of conductive material 340 includes an etching process. The etching process includes a wet chemical etching or a dry etching, such as a plasma etching. In some embodiments, the hard mask includes multiple materials having different etch selectivities. In some embodiments, a spacing between RDL structure 342 and 344 ranges from about 1 to about 3 micrometers (μm). The smaller spacing causes a step coverage of subsequent layers to be difficult, in some instances. The greater spacing decrease a flatness of subsequent layers, in some instances.

Figure 3C:
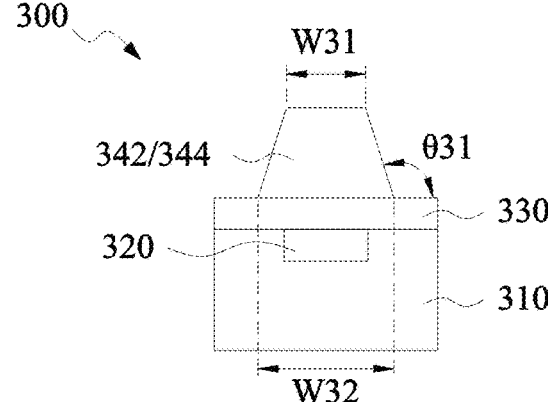

FIG. 3C is a schematic cross-sectional view of semiconductor device 300 in accordance with one or more embodiments. In some embodiments, RDL structure 342/344 has a trapezoid shape. A top portion of RDL structure 342/344 has a first width W31 ranging from about 1 to about 1.8 μm. Greater first width W31 reduces an area usage for wiring to provide connections for components within semiconductor device 300, in some instances. Smaller width W31 increases a risk of electron migration failure, in some instances. A bottom portion of RDL structure 342/344 includes a second width W32 ranging from about 1.2 to about 2 μm. Smaller second width W32 generates more defects during a subsequent deposition of protective layers, in some instances. Greater second width W32 increases a size of a chip or increases a risk of a short between each other, in some instances. An angle θ31 of a side portion of RDL structure 342/344 relative to a top surface of first passivation layer 330 ranges from about 92 to about 97 degrees. Greater angle θ31 causes formation of RDL structure 342/344 to be more difficult, in some instances. Smaller angle θ31 generates more defects during the subsequent deposition, in some instances. Alternatively, RDL structure 342/344 has a rectangular shape.

Returning to FIG. 2, method 200 continues with operation 240 in which a second passivation layer is deposited over the RDL structure. In some embodiments, the second passivation layer is over at least a portion of the conductive pads. In some embodiments, the second passivation layer protects the RDL structure from moisture, radiation, damage and contamination. In some embodiments, the second passivation layer generates a strain/stress to change a shape of the RDL structure. In some embodiments, a strain/stress is caused by interactions between Si—H or N—H bonds. For example, an ion bombardment after a deposition of silicon- and nitrogen-containing radicals leads to a compressive stress. In some embodiments, the strain/stress is caused by a mobility of reactive ions. For example, a slow mobility of reactive ions leads to an accumulated lattice mismatch, resulting in a compressive stress. In some embodiments, the second passivation layer is formed in a fashion similar to the first passivation layer. In some embodiments, the second passivation layer is formed in a fashion different from the first passivation layer. For example, the first passivation layer is formed by an atomic layer deposition (ALD) process and the second passivation layer is formed by a CVD process, in some embodiments. In some embodiments, the second passivation layer includes the same materials as the first passivation layer. In some embodiments, the second passivation layer includes different materials from the first passivation layer.

Figure 3D:
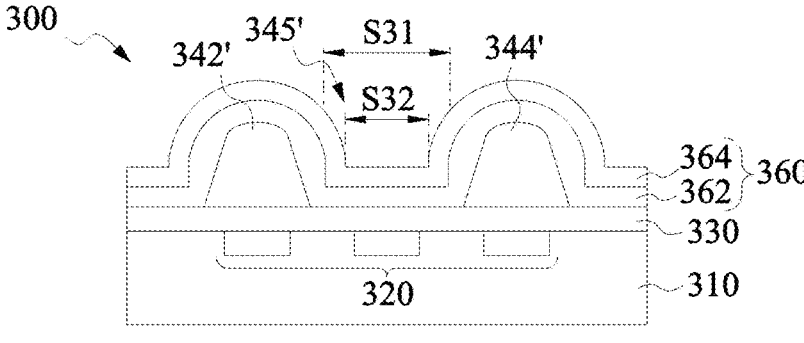

FIG. 3D is a cross-sectional view of a semiconductor device 300 following operation 240 in accordance with one or more embodiments. A second passivation layer 360 is formed over and causes a stressed RDL structure 342'/344'. In some embodiments, second passivation layer 360 includes a strain/stress ranging from about 0.5 to about 1 GPa. The greater strain/stress negatively impacts electrical properties of stressed RDL structure 342'/344', in some instances. The smaller strain/stress provides insufficient shape change of stressed RDL structure 342'/344', in some instances. Second passivation layer includes a first insulating material 362 and a second insulating material 364. First insulating material 362 partially fills the space between RDL structure 342 and 344. In some embodiments, first insulating material 362 includes undoped silicate glass (USG), boron-doped silicate glass (BSG), phosphor-doped silicate glass (PSG), boron-phosphor-doped silicate glass (BPSG), silicon oxy-nitride, silicon nitride, and/or another suitable material. In some embodiments, second insulating material 364 includes silicon nitride, silicon oxynitride or another suitable material that causes a strain/stress. The formation of second passivation layer 360 includes a deposition process, such as plasma-enhanced CVD (PECVD), low pressure CVD (LPCVD), ALD or SOD. In some embodiments, the CVD is performed by alternating deposition mode and sputtering mode during the formation of second passivation layer 360. In some embodiments, a temperature of the deposition and sputtering processes ranges from about 100 to about 300 degrees Celsius. The greater temperature varies a physical property of second passivation layer 360 from the compressive strain/stress to a tensile strain/stress, in some instances. The lower temperature provides insufficient strain/stress to cause the shape change, in some instances. In some embodiments, an energy of the sputtering process ranges from about 30,000 to about 70,000 Watts. The lower energy reduces the caused strain/stress, in some instances. The greater energy increases a damage to a top surface of RDL structure 342'/344', in some instances. In some embodiments, a first thickness of first insulating layer 362 ranges from about 0.25 to about 0.75 μm. The greater first thickness reduces an effect of the strain/stress, in some instances. In some embodiments, a second thickness of second insulating layer 364 ranges from about 0.5 to about 1.5 μm. The smaller second thickness reduces an effect of the strain/stress, in some instances. In some embodiments, a ratio of the second thickness to the first thickness ranges from about 1 to about 3. The greater or smaller ratio increases the difficulty of controlling a shape of stressed RDL structure 342'/344', in some instances. Trench 345' is formed between stressed RDL structures 342' and 344'. Trench 345' is an opening defined by a top portion of sidewalls of passivation layer 360 and a bottom portion defined by a bottom portion of sidewalls of passivation layer 360. The opening of trench 345' has a first spacing S31 equal to or larger than a second spacing S32 of the bottom portion of trench 345'. As a result, a subsequent deposition process of one or more protective layers will have an improved step coverage.

FIG. 3E is a schematic cross-sectional view of semiconductor device 300 in accordance with one or more embodiments. Second passivation layer 360 causes a top portion of stressed RDL structure 342'/344' to have a rounded shape. As a result, stressed RDL structure 342'/344' has a cone shape. The top portion of RDL structure 342'/344' includes a diameter D31 and a bottom portion of RDL structure 342'/344' includes a second width W32. In some embodiments, diameter D31 ranges from about 1.2 to about 2 μm. Larger diameter D31 increases a quantity of voids formed during the subsequent deposition process, in some instances. Smaller diameter D31 reduces a conductivity of RDL structure 342'/344', in some instances. In some embodiments, second width W32' is maintained, ranging from about 1.2 to about 2 μm. An angle θ31' of a side portion of RDL structure 342'/344' relative to the top surface of first passivation layer 330 ranges from about 95 to about 100 degrees. Greater angle θ31' increases the difficulty of a formation of stressed RDL structure 342'/344', in some instances. Smaller angle θ31' increases the difficulty of controlling the step coverage of the subsequent deposition process of one or more protective layers, in some instances. In some embodiments, a height of RDL structure 342'/344' is equal to a height of RDL structure 342/344. In some embodiments, the height of RDL structure 342'/344' is greater than the height of RDL 342/344, ranging from about 10 to about 30 nanometers (nm). The smaller height difference provides insufficient strain/stress applied to RDL structure 342'/344', in some instances. The greater height difference increases a circuit RC delay and electron migration, in some instances.

Returning to FIG. 2, method 200 continues with operation 250 in which a protective layer is deposited over the second passivation layer. The protective layer further fills a trench between adjacent RDL structures. In some embodiments, the protective layer is over at least a portion of the conductive pad. In some embodiments, the protective layer helps absorb or release thermal or mechanical stress resulting from a subsequent packaging process. In some embodiments, the protective layer is formed in a fashion similar to the first passivation layer or the second passivation layer. In some embodiments, the second passivation layer is formed in a fashion different from at least one of the first passivation layer or the second passivation layer. The protective layer includes a dielectric material. In some embodiments, the protective layer includes the same materials as at least one of the first passivation layer or the second passivation layer. In some embodiments, the second passivation layer includes different materials from both the first passivation layer and the second passivation layer.

FIG. 3F is a cross-sectional view of a semiconductor device 300 following operation 250 in accordance with one or more embodiments. A protective layer 370 is over second passivation layer 360. In some embodiments, protective layer 370 includes a polymer, such as such as polyimide, BenzoCycloButene (BCB), PolyBenzOxazole (PBO), or the like. In some embodiments, the formation of protective layer 370 includes a deposition process, such as PECVD, LPCVD or another suitable method. The formation of protective layer 370 includes a spin coating, for example, protective layer 370 is dispensed in a liquid form, and then cured. In some embodiments, a thickness of protective layer 370 ranges from about 4.5 μm to about 15 μm. The smaller thickness results in an insufficient protection of the IC devices and RDL structure 342'/344' to provide electrical connections for components in semiconductor device 300, in some instances. If the thickness is too great, a manufacturing cost and time will be increased, in some instances. In some embodiments, a photolithography and etching process follow the deposition to expose a central portion of conductive pad 120. By forming a rounded shape at the top portion of RDL structure 342'/344', a filling of protective layer 370 into the trench between RDL structure 342' and 344' is improved. For example, because the opening of the trench is equal to or larger than the bottom portion of the trench, a formation of voids in protective layer 370 during the deposition process is reduced.

One of ordinary skill in the art would understand that semiconductor device 300 will undergo further processing to complete fabrication. For example, in at least one embodiment, a strain/stress property is adjusted by a curing process. The curing process includes an ultraviolet (UV) treatment, a plasma treatment or a laser anneal treatment or a flash anneal. In some embodiments, a temperature of the flash anneal ranges from 325 to about 500 degrees Celsius. After the curing process, the second passivation layer will have a greater strain/stress ranging from about 1.2 to 1.6 GPa. Thus, a diameter of a top portion of the RDL structure will be reduced after the curing process. As another example, the UBM structure is formed over the conductive pad or over the RDL structure. The UMB structure includes copper, copper alloys, titanium, titanium alloys or another suitable material. Subsequently, the bump, such as a solder ball or metal pillar, is formed over and electrically connected to the UBM structures. In some embodiments, the bump is electrically connected and bonded to another package component such as a die, an interposer, a printed circuit board (PCB) or the like.

FIG. 3G is a cross-sectional view of a semiconductor device 300 following operation 250 in accordance with one or more embodiments. Semiconductor device 300 includes an RDL structure 382/384. Due to various distributions of the strain/stress, a top portion of RDL structure 382/384 has a concave shape caused by second passivation layer 360, in some embodiments.

FIGS. 4A-4G are cross-sectional views taken along line L-L' in FIG. 1 at various stages of fabrication in accordance with one or more embodiments.

Figure 4A:
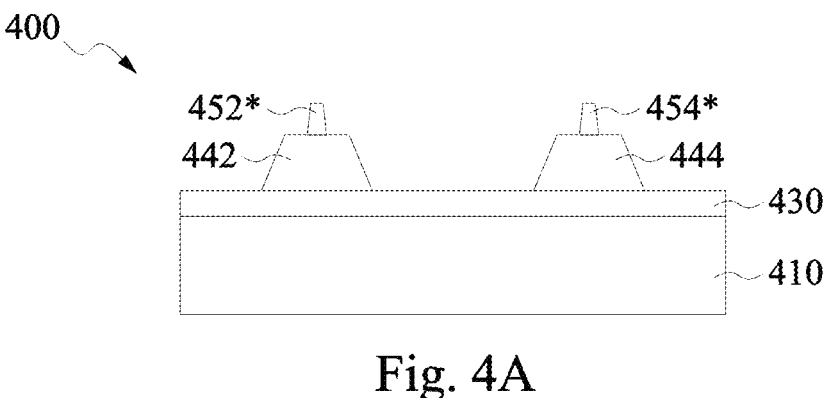
FIGS. 4A-4C are cross-sectional views taken along line L-L' in FIG. 1 at various stages of fabrication in accordance with one or more embodiments.

FIG. 4A is a cross-sectional view of a semiconductor device 400 following operation 250 in accordance with one or more embodiments. Semiconductor device 400 is similar to semiconductor device 300, like elements have a same reference number increased by 100. Semiconductor device 400 includes a substrate 410, a first passivation layer 430, an RDL structure 442/444 and a trimmed mask layer 452*/454*. In some embodiments, a bottom anti-reflecting coating (BARC) material is coated over a hard mask to provide a larger process window during a photolithography process. A photoresist is subsequently coated and patterned to define RDL structure 442/444. Next, trimmed mask layer 452*/454* is formed by a trimming process, such as an isotropic etching or an anisotropic etching, or an over-etching process. In some embodiments, the photoresist and the hard mask are trimmed simultaneously. In some embodiments, the photoresist is trimmed prior to the patterns transfer through the hard mask.

Returning to FIG. 2, method 200 continues with an optional operation 260 in which a portion of the RDL structure is removed. In some embodiments, a width of the trimmed mask layer is reduced to expose corners of the top portion of the RDL structure. Next, the exposed corners are removed by an etch process, such as a plasma etch or a wet etching. In some embodiments, the removal process is performed in the same etch process as the trimming process of the mask layer.

Figure 4B:
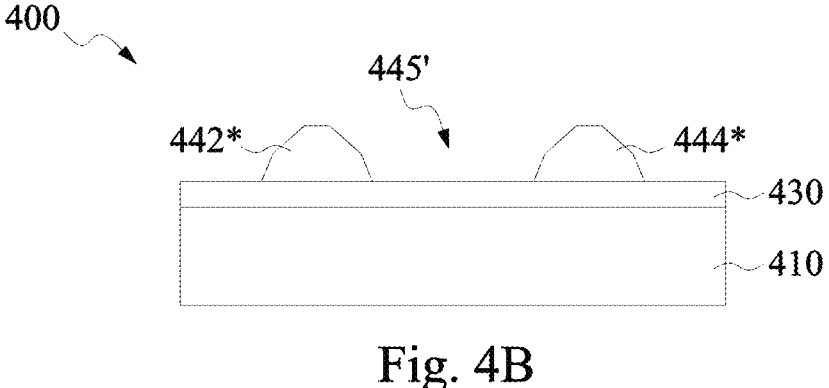

FIG. 4B is a cross-sectional view of a semiconductor device 400 following operation 260 in accordance with one or more embodiments. In some embodiments, corners of a top portion of RDL structure 442*/444* are removed by an etch process, such as a wet etching or a dry etching. The removed corners are defined by trimmed mask layer 452*/454*. In some embodiments, a top portion of RDL structure 442*/444* has a polygon shape, such as a hexagon. After the etch process, the trimmed mask layer 452*/454* (best seen in FIG. 4A) has a smaller top portion comparing to untrimmed mask layer 452/454.

Figure 4C:
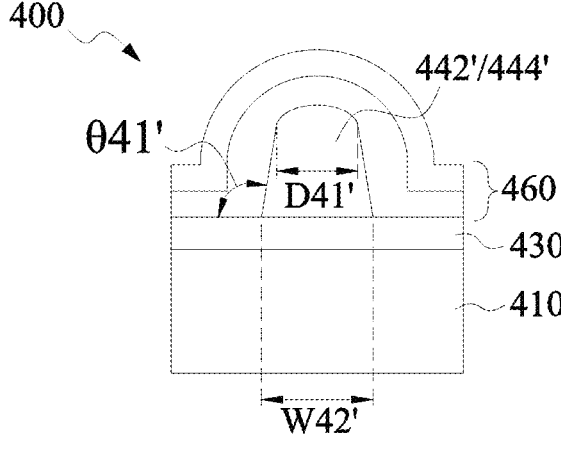

FIG. 4C is a schematic cross-sectional view of semiconductor device 400 in accordance with one or more embodiments. Second passivation layer 460 causes a top portion of RDL structure 442'/444' to have a rounded shape. The top portion of RDL structure 442'/444' includes a diameter D41' and a bottom portion of RDL structure 442'/444' includes a second width W42'. In some embodiments, diameter D41' ranges from about 0.5 to about 1 μm. Larger diameter D41' increases a quantity of voids formed during the subsequent deposition process, in some instances. Smaller diameter D41' reduces a conductivity of RDL structure 442'/444', in some instances. In some embodiments, second width 42' is maintained, ranging from about 1.2 to about 2 μm. An angle θ41' of a side portion of RDL structure 442'/444' relative to the top surface of first passivation layer 430 ranges from about 95 to about 100 degrees. Greater angle θ41 increases the difficulty of a formation of stressed RDL structure 442'/444', in some instances. Smaller angle θ41 causes poor step coverage of the subsequent deposition process of one or more protective layers, in some instances. In some embodiments, a height of RDL structure 442'/444' is equal to a height of RDL structure 442/444. In some embodiments, the height of RDL 442'/444' is greater than the height of RDL 442/444, ranging from about 10 to about 30 nanometers (nm). The smaller height difference provides insufficient strain/stress to RDL structure 442'/444' to change the shape of the RDL structure, in some instances. The greater height difference increases a circuit RC delay and electron migration, in some instances In some embodiments, additional operations are included in method 200, such as forming a protective layer between first passivation layer 330 and conductive material 340, depositing a seed layer to aid a formation of conductive material 340 or other suitable operations. In some embodiments, an order of operations for method 200 is modified. In some embodiments, multiple operations for method 200 are performed simultaneously. For example, operation 230 and operation 260 are performed simultaneously, in some instances.

Because the top portion of RDL structure has a rounded shape, a deposition process of the protective layer will have an improved step coverage and help to avoid defects, such as a gas void or a bubble defect, formed between a trench of adjacent RDL structures. Further, the rounded shape helps prevent the RDL structure from electrical discharge and arcing, resulting in a proper electrical property, reduced manufacturing cost and production yield.

An aspect of this description relates to a semiconductor device. The semiconductor device includes a first passivation layer over a substrate. The semiconductor device further includes a post passivation interconnect (PPI) line over the first passivation layer, wherein a top-most portion of the PPI line has a first portion having a convex shape and a second portion having a concave shape. The semiconductor device further includes a second passivation layer configured to cause stress to the PPI line. The semiconductor device further includes a polymer material over the second passivation layer. In some embodiments, the top-most portion of the PPI line has a third portion having a convex shape. In some embodiments, the second portion is between the first portion and the third portion. In some embodiments, the second passivation layer includes a first sub-layer directly contacting the PPI line; and a second sub-layer over the first sub-layer. In some embodiments, the first sub-layer comprises a first material, and the second sub-layer comprises a second material different from the first material. In some embodiments, the first sub-layer has a first thickness, and the second sub-layer has a second thickness different from the first thickness. In some embodiments, the semiconductor device includes an interconnect structure, wherein the first passivation layer is over the interconnect structure. In some embodiments, the PPI line is electrically connected to the interconnect structure. In some embodiments, the semiconductor device includes a bump electrically connected to the PPI line. In some embodiments, the semiconductor device further includes an under bump metallurgy (UBM) layer between the PPI line and the bump.

An aspect of this description relates to a semiconductor device. The semiconductor device includes an interconnect structure. The semiconductor device further includes a first passivation layer over the interconnect structure. The semiconductor device further includes a first post passivation interconnect (PPI) line over the first passivation layer, wherein a top-most portion of the first PPI line has a first portion having a convex shape, a second portion having a concave shape, and a third portion having the convex shape, and the second portion is between the first portion and the third portion. In some embodiments, the semiconductor device further includes a second passivation layer over the first PPI line. In some embodiments, the second passivation layer directly contacts each of the first portion, the second portion, and the third portion. In some embodiments, the semiconductor device further includes a second PPI line over the first passivation layer, wherein a top-most portion of the second PPI like has the convex shape. In some embodiments, the semiconductor device further includes a polymer layer between the first PPI line and the second PPI line. In some embodiments, the first PPI line is electrically connected to the interconnect structure.

An aspect of this description relates to a method of making a semiconductor device. The method includes depositing a first passivation layer over an interconnect structure. The method further includes forming a post passivation interconnect (PPI) line over the first passivation layer. The method further includes depositing a second passivation layer over the PPI line, wherein the second passivation layer is configured to exert stress on the PPI line to form a top-most portion of the PPI line having a first portion having a convex shape, a second portion having a concave shape, and a third portion having the convex shape. In some embodiments, forming the PPI line includes depositing a conductive layer over the first passivation layer; and patterning the conductive layer to define the PPI line having a substantially flat top-most surface. In some embodiments, the method further includes depositing a polymer layer over the second passivation layer. In some embodiments, forming the PPI line includes forming the PPI line in electrical connection with the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a first passivation layer over a substrate;

a post passivation interconnect (PPI) line over the first passivation layer, wherein a top-most portion of the PPI line has a first portion having a convex shape and a second portion having a concave shape;

a second passivation layer configured to cause stress to the PPI line; and a polymer material over the second passivation layer.

2. The semiconductor device of claim 1, wherein the top-most portion of the PPI line has a third portion having a convex shape.

3. The semiconductor device of claim 2, wherein the second portion is between the first portion and the third portion.

4. The semiconductor device of claim 1, wherein the second passivation layer comprises:

a first sub-layer directly contacting the PPI line; and a second sub-layer over the first sub-layer.

5. The semiconductor device of claim 4, wherein the first sub-layer comprises a first material, and the second sub-layer comprises a second material different from the first material.

6. The semiconductor device of claim 4, wherein the first sub-layer has a first thickness, and the second sub-layer has a second thickness different from the first thickness.

7. The semiconductor device of claim 1, further comprising an interconnect structure, wherein the first passivation layer is over the interconnect structure.

8. The semiconductor device of claim 7, wherein the PPI line is electrically connected to the interconnect structure.

9. The semiconductor device of claim 1, further comprising a bump electrically connected to the PPI line.

10. The semiconductor device of claim 9, further comprising an under bump metallurgy (UBM) layer between the PPI line and the bump.

11. A semiconductor device comprising:

an interconnect structure;

a first passivation layer over the interconnect structure;

a first post passivation interconnect (PPI) line over the first passivation layer, wherein a top-most portion of the first PPI line has a first portion having a convex shape, a second portion having a concave shape, and a third portion having the convex shape, and the second portion is between the first portion and the third portion;

a second PPI line over the first passivation layer; and a polymer layer over the first PPI line and the second PPI line, wherein the polymer layer is physically separated from each of the first PPI line and the second PPI line, and the polymer layer is between the first PPI line and the second PPI line in a direction parallel to a top surface of the first passivation layer.

12. The semiconductor device of claim 11, further comprising a second passivation layer over the first PPI line.

13. The semiconductor device of claim 12, wherein the second passivation layer directly contacts each of the first portion, the second portion, and the third portion.

14. The semiconductor device of claim 11, wherein a top-most portion of the second PPI line has the convex shape.

15. The semiconductor device of claim 12, wherein the polymer layer is over the second passivation layer.

16. The semiconductor device of claim 11, wherein the first PPI line is electrically connected to the interconnect structure.

17. A semiconductor device comprising:

a first passivation layer over a substrate;

a first post passivation interconnect (PPI) line over the first passivation layer, wherein a top-most portion of the first PPI line has a first portion having a convex shape and a second portion having a concave shape;

a second PPI line over the first passivation layer;

a second passivation layer exerting stress on the first PPI line and the second PPI line; and a polymer material over the second passivation layer.

18. The semiconductor device of claim 17, wherein the second PPI line has a curved top surface.

19. The semiconductor device of claim 17, wherein the second passivation layer comprises a plurality of insulating layers.

20. The semiconductor device of claim 17, wherein a first distance from a bottommost surface of the polymer layer to a top surface of the substrate is less than a second distance from a top-most surface of the second PPI line to the top surface of the substrate.

* * * * *